(12) United States Patent
Srinivasan et al.

(10) Patent No.: US 9,501,599 B2
(45) Date of Patent: Nov. 22, 2016

(54) SENSOR CIRCUIT DESIGN TOOL

(71) Applicant: TEXAS INSTRUMENTS INCORPORATED, Dallas, TX (US)

(72) Inventors: Shrikrishna Srinivasan, San Jose, CA (US); Pradeep Chawda, Cupertino, CA (US); Srikanth Pam, Hyderabad (IN); Dien Mac, San Jose, CA (US); Makram Mansour, San Jose, CA (US); Jeff Perry, Cupertino, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 205 days.

(21) Appl. No.: 14/283,812

(22) Filed: May 21, 2014

(65) Prior Publication Data
US 2015/0339421 A1 Nov. 26, 2015

(51) Int. Cl.
G06F 17/50 (2006.01)

(52) U.S. Cl.
CPC ........... G06F 17/5068 (2013.01); G06F 17/50 (2013.01); G06F 17/5009 (2013.01); G06F 17/5045 (2013.01); G06F 17/5063 (2013.01)

(58) Field of Classification Search
USPC .......................... 320/260; 716/102, 139, 132
See application file for complete search history.

(56) References Cited

U.S. PATENT DOCUMENTS

| | | | |
|---|---|---|---|
| 6,530,065 B1* | 3/2003 | McDonald | G06F 17/5036 716/102 |
| 2003/0229861 A1* | 12/2003 | Quigley | G06F 17/50 716/102 |
| 2010/0325599 A1* | 12/2010 | Perry | G06F 17/50 716/122 |
| 2013/0033273 A1* | 2/2013 | Thoss | H03K 17/9512 324/654 |
| 2014/0137067 A1* | 5/2014 | Duff | H03H 11/1221 716/132 |
| 2014/0250417 A1* | 9/2014 | Bantas | G06F 17/5068 716/132 |
| 2015/0077094 A1* | 3/2015 | Baldwin | G01B 7/003 324/207.17 |
| 2016/0012171 A1* | 1/2016 | Visconti | G06F 17/5072 716/122 |

OTHER PUBLICATIONS

Roach, Steven D., "Electric/Magnetic Designing and Building an Eddy Current Position Sensor", Sep. 1, 1998., Sensors Magizine, obtained at http://www.sesnsorsmag.com/sensors/electric-magnetic/designing-andbuilding-eddy-current-position-sensor-772. pp. 1-50.*

Albing, Brad, "Designing with an Iductance to Digital Converter", Oct. 9, 2013, Planet Analog all signal no noise, obtained at http://planetanalog.com/author.asp?section_id=385&doc_id=561455, pp. 1-4.*

* cited by examiner

*Primary Examiner* — Stacy Whitmore
(74) *Attorney, Agent, or Firm* — Gregory J. Albin; Frank D. Cimino

(57) ABSTRACT

A system includes a user input engine to receive input via a graphical user interface (GUI) through a first window, the input including a distance value and an input resolution value. The system also includes a sensor circuit solution generation engine to generate a plurality of sensor circuit solutions based on the received input and to cause the plurality of sensor circuit solutions to be displayed. Each sensor circuit solution specifies information about a conductive coil.

17 Claims, 12 Drawing Sheets

Solutions: (20 found)

| Part | Create | Coil Footprint (cm²) | Coil Turns (#) | Coil Diameter (cm) | Layers (#) | Resolution (μm) | Free Field Inductance (μH) | Rp @ Distance (kΩ) | External Capacitance (pF) | Free Field Frequency (Hz) |
|---|---|---|---|---|---|---|---|---|---|---|
| PCB inductor coil 1 | Open Design | 13.39 | 98 | 4.13 | 2 | 1.41 | 571.13 | 110.97966 | 44.35 | 1000000 |
| PCB inductor coil 2 | Open Design | 15.27 | 105 | 4.41 | 2 | 1.28 | 692.59 | 132.42581 | 36.57 | 1000000 |
| PCB inductor coil 3 | Open Design | 17.27 | 112 | 4.69 | 2 | 1.18 | 840.62 | 157.58602 | 30.13 | 1000000 |
| PCB inductor coil 4 | Open Design | 19.4 | 119 | 4.97 | 2 | 1.1 | 1001.25 | 184.50552 | 25.29 | 1000000 |
| PCB inductor coil 5 | Open Design | 21.31 | 125 | 5.21 | 2 | 1.04 | 1138.92 | 207.57938 | 22.24 | 1000000 |
| PCB inductor | | | | | | | | | | |

| Name | Value | Description |
|---|---|---|
| capacitance (pF) | 44.4 | Capacitance required for oscillation at resonance frequency |
| inductance (μH) | 571 | Free field inductance of PCB coil - without target in vicinity |
| Free field frequency (Hz) | 1000K | Free field frequency of operation - without target in vicinity |
| Number of turns | 98 | Number of turns of PCB inductor coil |
| Number of layers | 2 | Number of layers of PCB - determines number of inductors in series on separate PCB layers |
| Coil diameter (cm) | 4.13 | Outer diameter of the selected coil - note the hole at the center of the coil to accommodate for vias |
| Coil trace width (mil) | 4 | Coil trace width to obtain required inductance and series resistance |
| Coil trace spacing (mil) | 4 | Coil trace spacing to obtain required inductance and series resistance |
| Coil trace thickness (mil) | 1.5 | Coil trace thickness to obtain required inductance and series resistance |
| Coil trace conductivity (M S/m) | 58 | Coil trace conductivity to obtain required inductance and series resistance |
| Target Radius (cm) | 5 | Radius of the target |
| Target Material | Stainless Steel - SS416 | Target material |
| Target Conductivity (M S/m) | 1.5 | Conductivity of the target |
| Target Relative Permeability | 500 | Relative permeability of the target |

| Part | Manufacturer | Part Number | Quantity | Price | Attributes | Footprint |
|---|---|---|---|---|---|---|
| Ctank | AVX | 06035A390FAT2A | 1 | $0.10 | Cap = 3.9E-11 F, Tolerance = 1 %, ESR = 0.0 Ohm | 4.7175 |
| Ltank | | PCB coil | 1 | NA | | NA |
| IC | Texas Instruments | LDC1000 | 1 | $2.95 | | 20 |

350, 352, 354, 356, 358, 360

SENSOR CIRCUIT DESIGN TOOL

CROSS-REFERENCE TO RELATED APPLICATION

N/A

BACKGROUND

The design of electrical circuits may be a daunting task particularly in the face of a large number of circuit components from which to choose. In many instances, multiple different circuit designs may be possible to achieve a desired result. Numerous parts may be available from which to choose and such parts may be connected in various different ways.

SUMMARY

Some embodiments are directed to a non-transitory storage device containing machine readable instructions that, when executed by a processing resource, cause the processing resource to perform various actions. Such actions may include receiving input from a user via a graphical user interface (GUI) through a first window, the input including a distance value and an input resolution value, as well as detecting selection by the user of a soft control. As a result of detecting selection of the soft control, the actions may also include generating a plurality of sensor circuit solutions based on the received input; and causing the plurality of sensor circuit solutions to be displayed. Each sensor circuit solution specifies information about a conductive coil.

A system includes a user input engine to receive input via a GUI through a first window, the input including a distance value and an input resolution value. The system also includes a sensor circuit solution generation engine to generate a plurality of sensor circuit solutions based on the received input and to cause the plurality of sensor circuit solutions to be displayed. Each sensor circuit solution specifies information about a conductive coil.

BRIEF DESCRIPTION OF THE DRAWINGS

For a detailed description of exemplary embodiments of the invention, reference will now be made to the accompanying drawings in which:

FIGS. 5 and 9-11 provide examples of the content of the various windows in the GUI of FIG. 4;

FIGS. 13-19 provide examples of the content of the various windows in the GUI of FIG. 9.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The embodiments disclosed herein are directed to a circuit design tool. The disclosed tool is particularly well-suited for facilitating the design of inductance-to-digital conversion (LDC) circuits. Such circuits may be designed to be used with a sensor to enable precise measurement of, for example, distance, linear/angular position, motion, compression, etc. In one implementation, the circuit may include an inductance-to-digital converter such as the LDC1000 from Texas Instruments Inc. An external conductive coil and an external capacitor preferably is connected to the inductance-to-digital converter as illustrated in FIG. 1.

Figure 1:
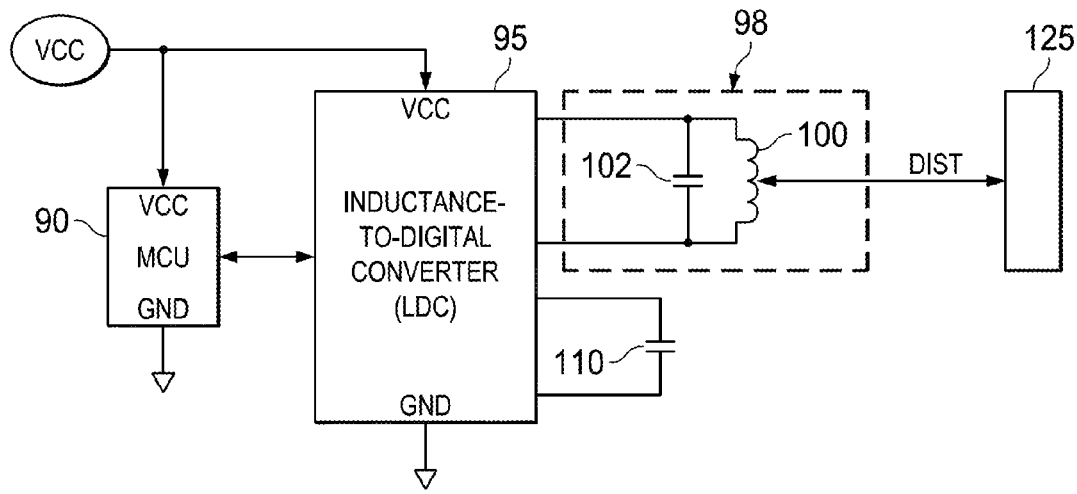
FIG. 1 shows an example of a sensor circuit in accordance with various embodiments.

FIG. 1 shows a circuit including a microcontroller unit (MCU) 90 coupled to an LDC 95. A sensor 98 also connects to the LDC 95 as well as a capacitor 110. The sensor 98 preferably includes a conductive coil 100 with a parallel capacitor 102. At least one application of the circuit is to measure the distance (DIST) between the coil 100 and a target object 125. The target object 125 preferably is metal. As the metal target 125 is brought into the proximity of the coil 100, electrical eddy currents are induced on the surface of the target 125. These eddy currents are a function of the distance, size and composition of the target 125. The eddy currents then generate their own magnetic field, which opposes the magnetic field generated by the coil itself. The resistance and inductance of the target 125 with eddy currents shows up as a distance-dependent resistive and inductive component on the coil 100. The LDC 95 measures the resistive contribution of the target 125 on to the coil 100 and, from that, determines the DIST.

The coil 100 preferably is a combination of 2 or 4 coils which may be stacked one on top of the other and mounted or formed on a printed circuit board (PCB). Each coil preferably is on a different layer of the PCB, and thus the design tool may refer to the number of coils as the number of "layers" (i.e., number of layers equals the number of coils). The design of the coil 100 and the selection of a suitable capacitor 102 is not a trivial task. Given a particular distance (DIST) range to be measured, a desired resolution and a preferred material type of the target 125, the various decision points to be made about the design of coil 10 include any or all of:

Coil diameter—distance from one side of coil to the other through the center
Coil footprint size—area spanned by the coil
Number of coils
Number of turns for the coil
Frequency
External capacitance (102)

Multiple possible circuit designs are possible for a given set of input criteria (distance, resolution, etc.) and a circuit designer may desire to be informed of all possible solutions along with a comparison of such solutions so that the designed can pick a particular solution.

Figure 2:
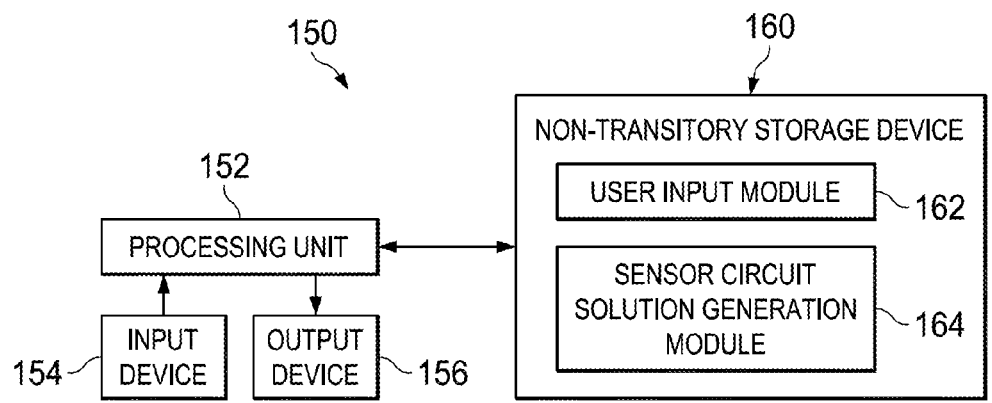
FIGS. 2 and 3 include examples of sensor circuit design tools.

The design tool described herein facilitates the circuit design process. FIG. 2 shows a preferred embodiment of a system 150 for implementing an LDC design tool. The system 150 includes a processing unit 152 coupled to an input device 154, an output device 156, and a non-transitory storage device 160. The processing unit 152 may include a single processor, a plurality of processors, a single computer, multiple computers, or any other type of processing unit. The input device 154 may include a keyboard and/or a pointing device (e.g., mouse, trackpad, etc.). The output device 156 may include a display. The input device 154 and output device 156 may be directly connected to the processing unit 152 (e.g., all as part of one computer) or the input device 154 and output device 156 may be remotely coupled to the processing unit 152 via a network. In this latter embodiment, the processing unit 152 may be, or may be included as part of, a server and may provide an on-line service accessible by a remote computer running a browser via the input device 154 and output device 156.

Figure 3:
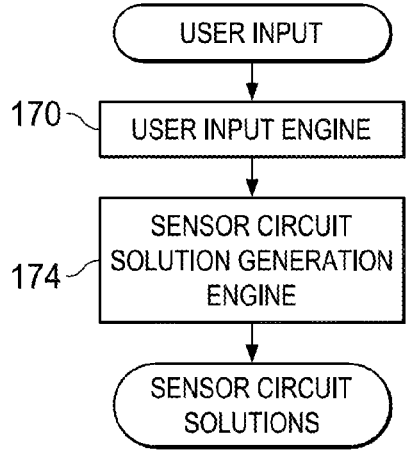

The non-transitory storage device 160 may be connected directly or remotely accessible by the processing unit 152. The non-transitory storage device 160 may include volatile memory (e.g., random access memory) or non-volatile storage such a hard drive, optical disc, flash storage, etc. The non-transitory storage device 160 includes a user input module 162 and a sensor circuit solution generation module 164. Modules 162 and 164 preferably include machine readable instructions that are executable by processing unit 152. The combination of the processing unit 152 executing a particular module implements an "engine" as illustrated in FIG. 3, which shows another embodiment of a system in accordance with the disclosed principles. A user input engine 170 is the processing unit 152 executing the user input module 162, and the sensor circuit solution generation module 174 is the processing unit 152 executing the sensor circuit solution generation module 164. Various user inputs are provided via the user input engine 170 to the sensor circuit solution generation engine 174. The sensor circuit solution generation engine 174 processes the input to generate and display various possible sensor circuit solutions that comport with the user's input.

Figure 4:
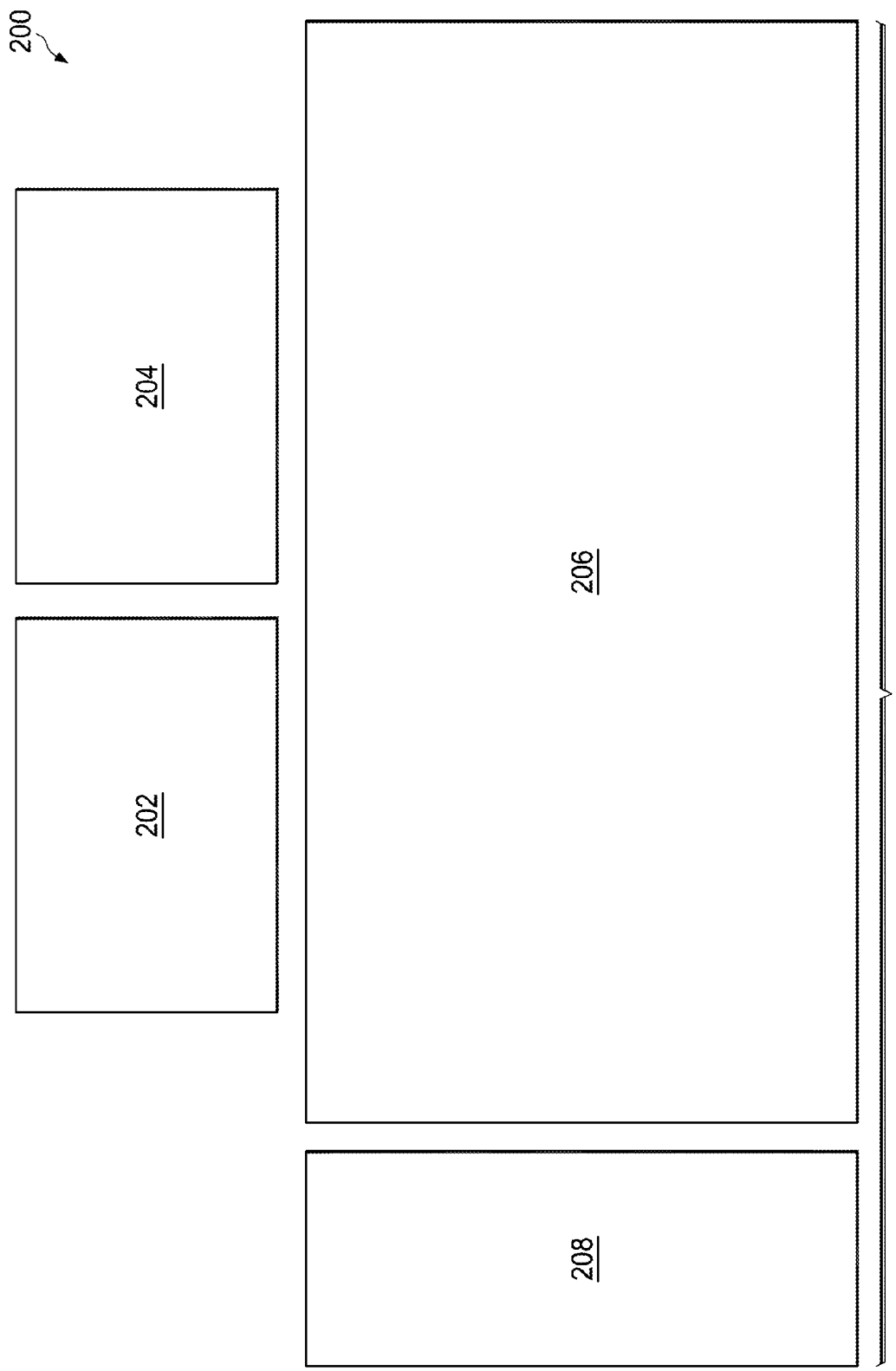
FIG. 4 shows a GUI having multiple windows and implemented by the disclosed sensor circuit design tool.

FIG. 4 shows an example of a graphical user interface (GUI) 200. The GUI 200 of FIG. 4 may be displayed on the output device 156 and a user may interact with GUI 200 using the input device 154 to design a sensor circuit. The GUI example of FIG. 4 includes four windows 202-208, although a different number of windows may be provided in other examples. Examples of the content of each window 202-208 are provided in FIGS. 5-8. Window 202 preferably is the window in which the user provides input for the tool to use to generate the various sensor circuit solutions. Window 204 is a filter window in which the user can adjust various filters to refine the set of solutions being presented. Window 206 includes a list (e.g., a table) of the various sensor circuit solutions and window 208 includes a graph in which the various sensor circuit solutions are plotted for easy comparison. Illustrative content in the windows in FIG. 4 has been eliminated due to space constraints, but such content is illustrated in subsequent figures.

Figure 5:
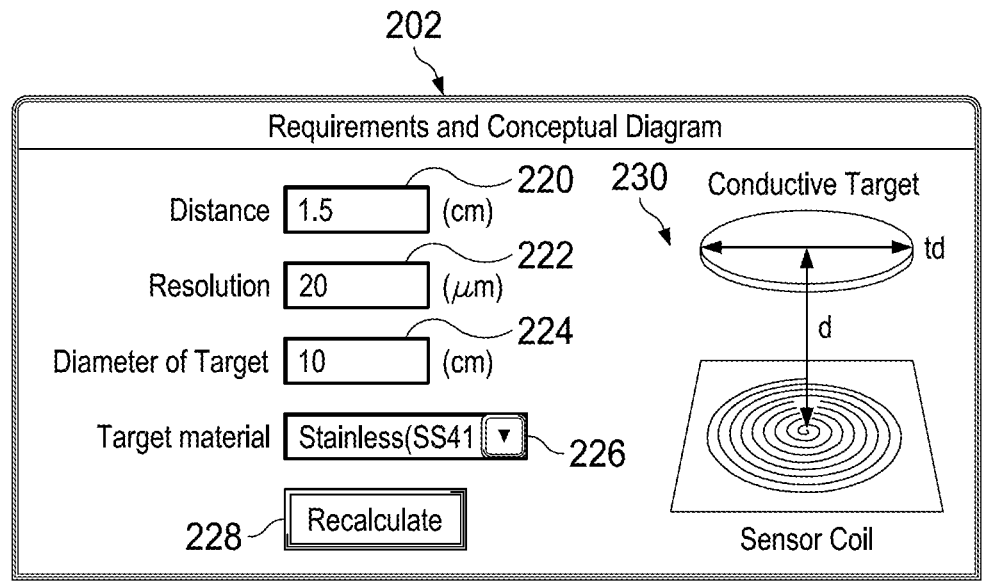

FIG. 5 shows an example of the user input window 202. The window includes four user input fields 220-226 and one soft control 228 to cause the tool to begin calculating the sensor circuit solutions. The user input engine 170 receives input from the user via the various fields and passes the user input to the sensor circuit solution generation engine 174.

Input field 220 permits a user to input a maximum distance value. The image 230 on the right-hand side of user input window 202 defines two parameters associated with the coil design. The value "d" represents the distance between the coil 100 and the target 125. The value target diameter ("td") represents the diameter of the target 125 (which preferably is circular). The distance value input into field 220 can be, for example, typed into field 220. The distance value input by the use represents the intended maximum distance d for which the circuit is to be designed, and may be input in units of, for example, centimeters. In the example of FIG. 5, the distance value provided by a user is 1.5 cm. This means that the user is trying to design a circuit using an LDC that measures a maximum distance of approximately 1.5 cm.

Field 222 is used by the user to input a resolution (20 microns in the example of FIG. 5). The user enters a target diameter in field 224 (e.g., 10 cm). In the example of FIG. 5, the user is intending to design a sensor circuit using an LDC that measures a maximum distance of 1.5 cm with a worst case resolution of 20 microns and using a target 125 that has diameter of 10 cm. The user also may select a material for the target 125 from a drop-down menu displayed upon selection of field 226. The user then selects the "recalculate" button 228 and the sensor circuit solution generation engine 174 then calculates the various possible sensor circuit solutions.

Figure 6:
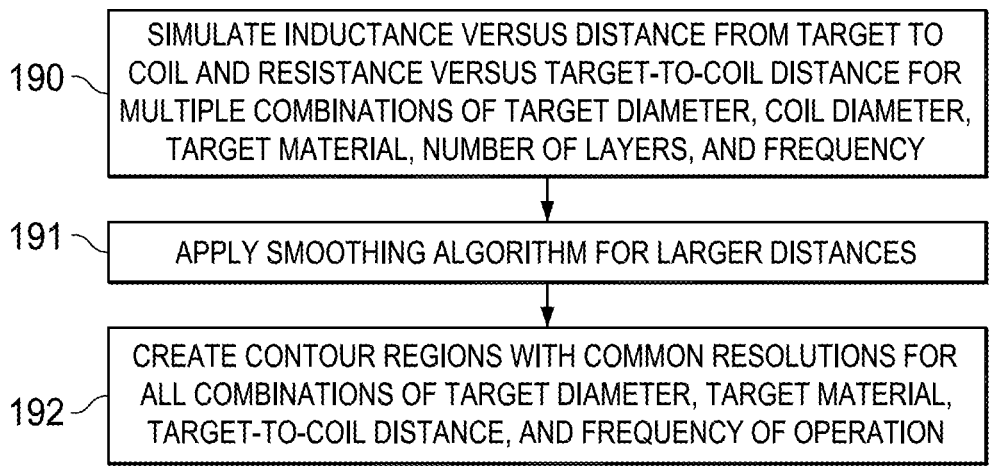
FIG. 6 shows an illustrative method for computing contours usable to generate the various circuit solutions.
Figure 7A:
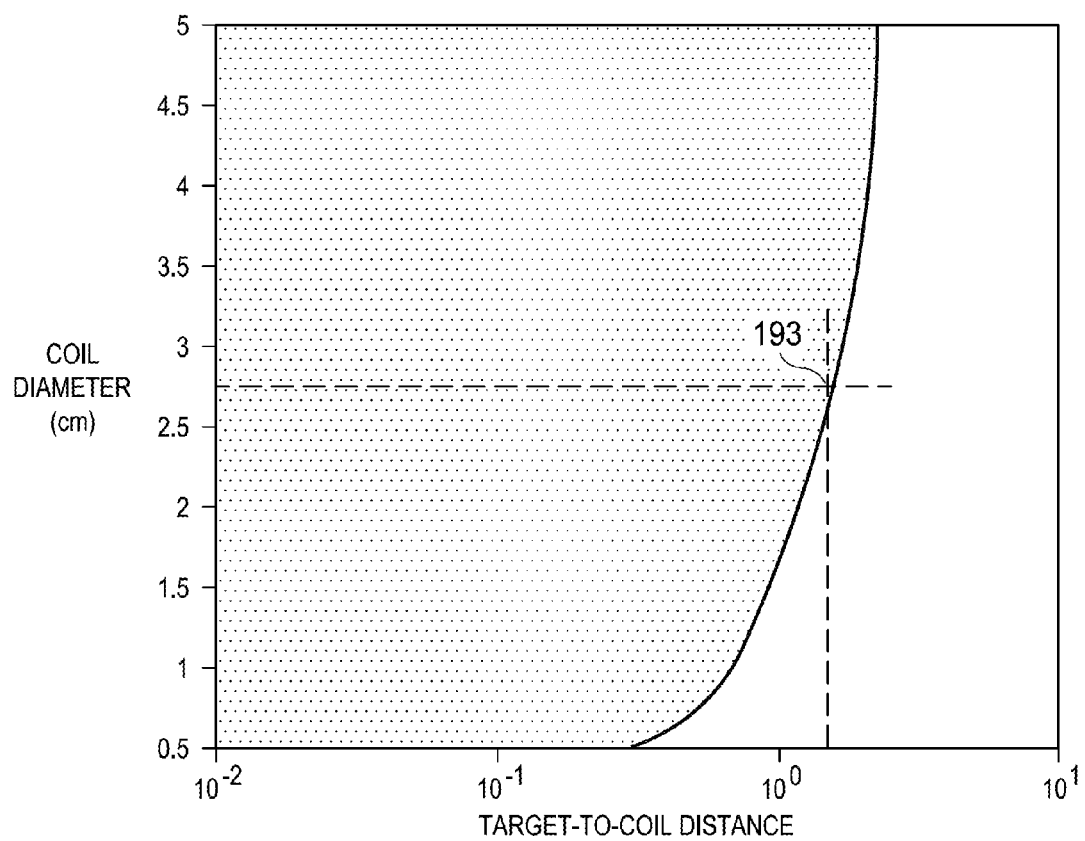
FIGS. 7*a* and 7*b* show examples of contours.
Figure 7B:
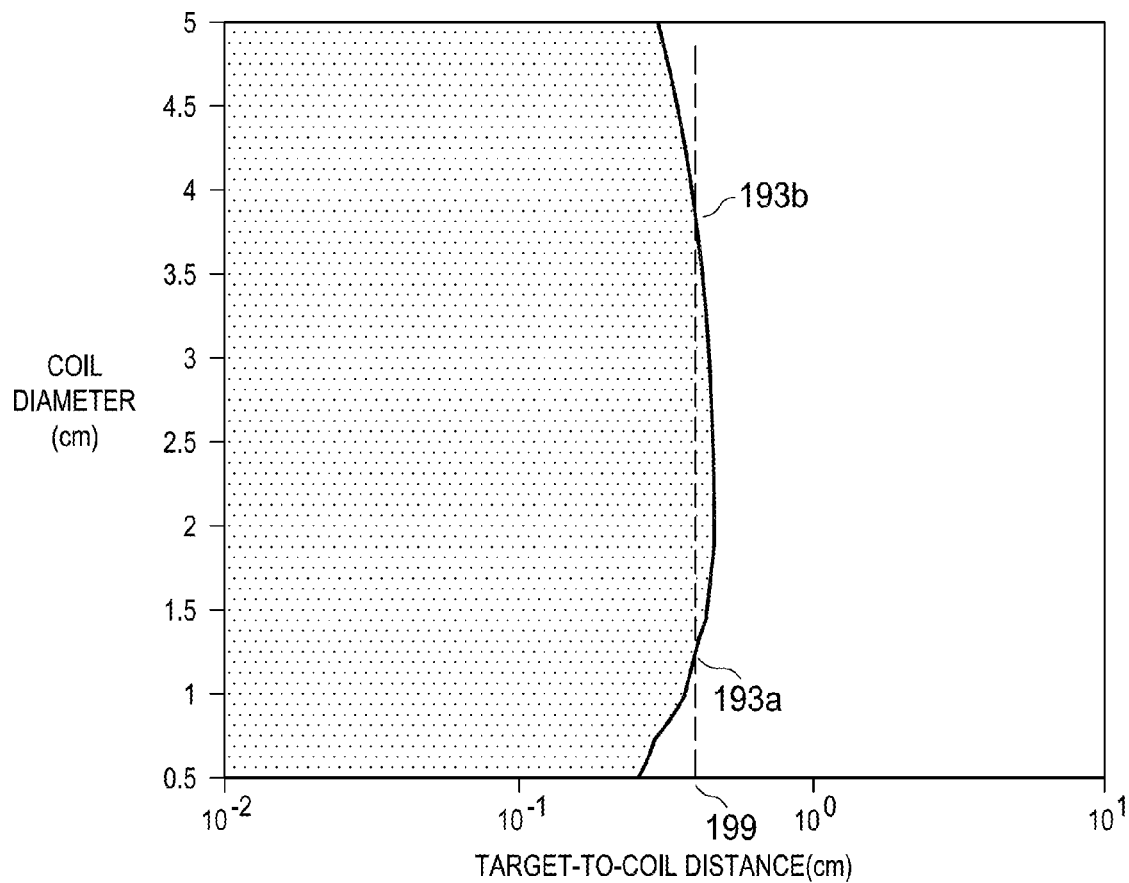
Figure 8:
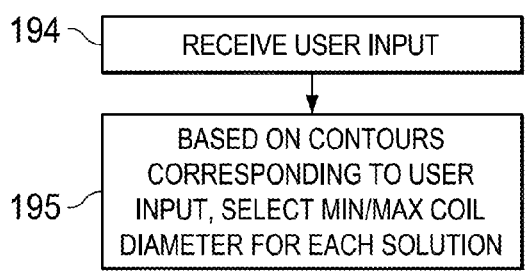
FIG. 8 shows an illustrative method of the use of the contours to generate the circuit solutions.

FIGS. 6-8 illustrate an embodiment of how the sensor circuit solutions may be generated. FIG. 6 shows an illustrative method that preferably is performed before a user attempts to use the sensor circuit design tool. At 190, simulations are determined for inductance versus target-to-coil distance as well as resistance versus target-to-coil distance. These simulations preferably are performed for various combinations of target diameter, coil diameter, target material, number of layers, and frequency of operation. An electromagnetic simulator may be used in this regard. Any number of simulated results may be obtained. The number of simulations may include dozens, hundreds, thousands, etc. In one example, 450,000 data points are obtained for the simulations.

At 191, a smoothing algorithm is applied for higher values of distance where noise may be more prevalent.

At 192, the method further includes creating contour regions using the simulated data. Each contour region corresponds to a particular combination of target diameter, target-to-coil distance, coil diameter, frequency of operation, and target material. A resolution value is common to all points within the contour.

FIGS. 7a and 7b provide examples of contour regions (or simply "contours"). The Y-axis in each contour is coil diameter and the X-axis is target-to-coil distance. Each data point within the contour's shaded region corresponds to a common resolution, target material, target diameter, and frequency of operation. All points within the shaded region correspond to circuit solutions that are acceptable for the user-specified input corresponding to that contour. In FIG. 7a, for a given target-to-coil distance at point 198, the coil diameter must be a minimum of approximately 2.75 as indicated by point 193 which crosses the outer boundary of the contour. Any coil diameter less than that, for the given target-to-coil distance will not be a satisfactory circuit solution given the corresponding set of resolution and other values.

In FIG. 7b, it should be noted that, for a given target-to-coil diameter as indicated by point 199, there are two coil diameters as indicated by points 193a and 193b that provided a minimum and a maximum coil diameter value, respectively. Any coil diameter greater than the maximum coil diameter at 193b or less than the minimum coil diameter at 193a will not be a satisfactory circuit solution given the corresponding set of resolution and other values.

FIG. 8 shows an example of a method for generating the various solutions once the contours are generated and stored in memory. At 194, the user input is received. The input is exemplified by the user interface of FIG. 5. At 195, based on the contours corresponding to the user input (and there may be multiple contours for a given set of user input values)), the method includes selecting the coil diameter (or possibly minimum and maximum coil diameters for a contour as in FIG. 7b). The coil diameters selected are the coil diameters from the contours that fall on or within the contours.

As explained above, the contour that matches the user's input values is selected as the contour from which the coil diameter is determined. If none of the pre-stored contours match the user's input values, then the tool interpolates between the available parameters to obtain a suitable contour.

FIG. 9 shows an example of the content of window 206 which includes the sensor circuit solutions generated by the sensor circuit solution generation engine 174. The list includes one or more solutions 209. Each solution 209 includes a part identifier field 240, a create field 242, a coil footprint field 244, a number of coil turns field 246, a coil diameter field 248, a number of layers field 250, a resolution field 252, a free field inductance field 254, a parallel resistance field 256, an external capacitance field 258, and a free field frequency field 260. These fields are described in the table below.

| Field | Description |
| --- | --- |
| Part identifier field 240 | Alphanumeric identifier of the solution |
| Create field 242 | Selectable soft control to cause additional information to be displayed for that particular solution |
| Coil footprint field 244 | Area spanned by the coil (cm$^2$) |
| Number of coil turns field 246 | Number of turns for the coil |
| Coil diameter field 248 | Diameter of the circular coil pattern |
| Number of layers field 250 | Number of coils (e.g., 2 or 4) |
| Resolution field 252 | The particular distance resolution for the solution (cm) |
| Free field inductance field 254 | Inductance (µH) of coils |
| Parallel resistance field 256 | Equivalent resistance (kΩ) of coil's parasitic series resistance and parasitic resistance of target's eddy currents. |
| External capacitance field 258 | Capacitance of external capacitor to be connected to LDC (pF) (e.g., capacitor 102) |
| Free field frequency field 260 | Target Frequency (Hz) |

Figure 10:
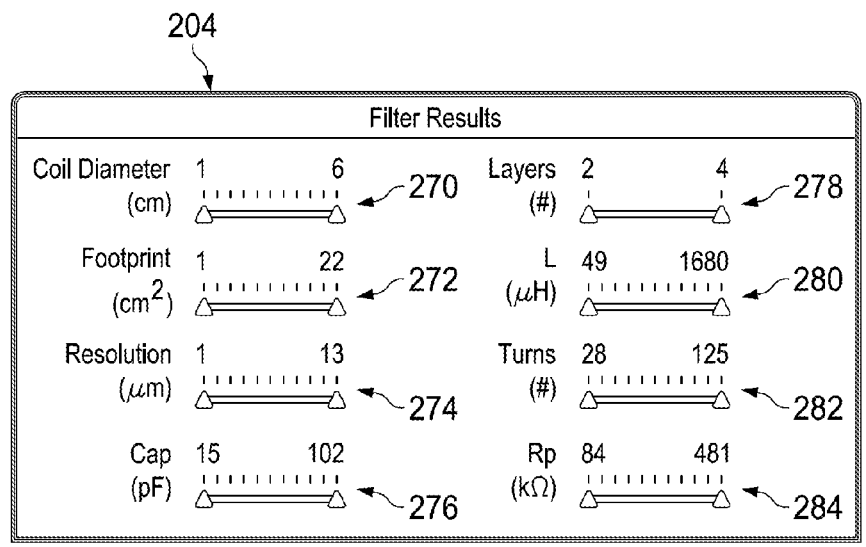

FIG. 10 shows an example of the filter window 204 in which the user can adjust various filters to refine the set of solutions being presented. The filter window 204 preferably includes a plurality of user-selectable slider controls. Each slider control includes a beginning slidable element and an ending slidable element that permits a user to narrow or broaden the scope of the parameter associated with slider control. For example, slider control 270 permits a user to control the range of the diameter for the coil. In the example of FIG. 10, the range of coil diameter, while still meeting the user's input criteria from FIG. 5, is 1 cm to 6 cm, but the user can narrow the coil diameter even further if desired, and doing so will cause certain solutions to be eliminated from the list of displayed solutions in FIG. 9. Slider control 272 permits a user to adjust the range of the coil footprint. Slider control 274 permits a user to adjust the range of resolution. Slider control 276 permits a user to adjust the range of the capacitance for the external capacitor 102. Slider control 278 permits a user to select 2 layers (coils) only, 2 or 4 layers, or 4 layers only, resulting in the solutions list to include solutions having only 2 layers, either 2 or 4 layers, or only 4 layers, respectively. Slider control 280 permits a user to adjust the range of free field inductance. Slider control 282 permits a user to adjust the range for the number of turns for the coils, and slider control 284 permits a user to adjust the range for the parallel resistance. The user can adjust any one or more (or all) of the slider controls and the sensor circuit generation engine 174 will automatically update the solutions displayed in window 206 to comport with the settings of the slider controls.

Figure 11:
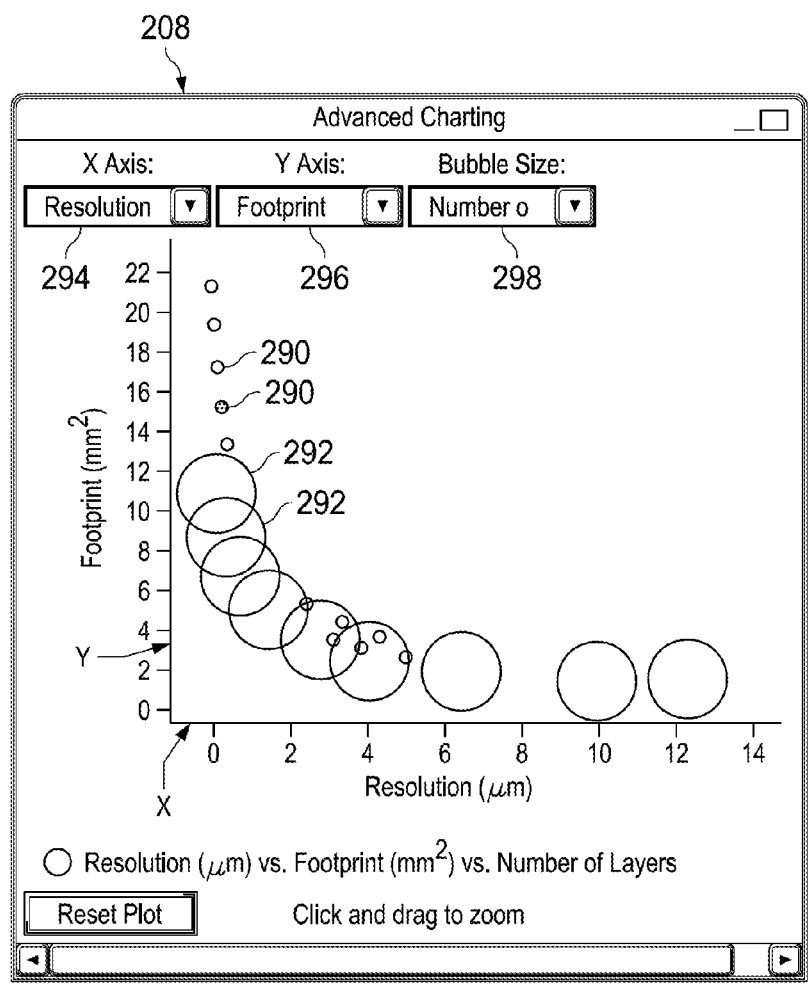

FIG. 11 shows an example of window 208 which includes a graph in which the various sensor circuit solutions are plotted. As shown, the y-axis is footprint size and the x-axis is resolution, although the axes can be different as selected by a user via controls 294 and 296. Control 294 permits a user to select from a drop down list which parameter is to be displayed on the x-axis. Similarly, control 296 permits a user to select from a drop down list which parameter is to be displayed on the y-axis. The choices in each drop down list preferably are identical and include: footprint size, inductance, parallel resistance, coil diameter, number of turns, external capacitance, and number of layers. Control 298 permits a user to select from a drop down list what the size of the bubbles represents. The drop down list for the bubble size may include: number of layers, inductance, parallel resistance, coil diameter, number of turns, resolution, footprint size and capacitance.

The example of FIG. 11 shows the bubble size as encoding the number of layers. As such, each solution from the list in window 206 is represented on the graph by way of a larger bubble 292 or a smaller bubble 290. The size of the bubbles represents the number of layers (coils) with the larger bubbles 292 representing a four layer solution and the smaller bubbles representing a two layer solution. Each solution, as explained above, is defined in part by a footprint size and a resolution. The center of each bubble is located on the graph so as to correspond to its footprint size and a resolution and the y and x-axes, respectively.

Further, as the user selects a particular solution in window 206 (e.g., by clicking on a solution using input device 154), the selected solution is visually indicated in the graph in window 208 to provide an easy mechanism to see how a particular solution compares to the other solutions in terms of footprint size and resolution.

Figure 12:
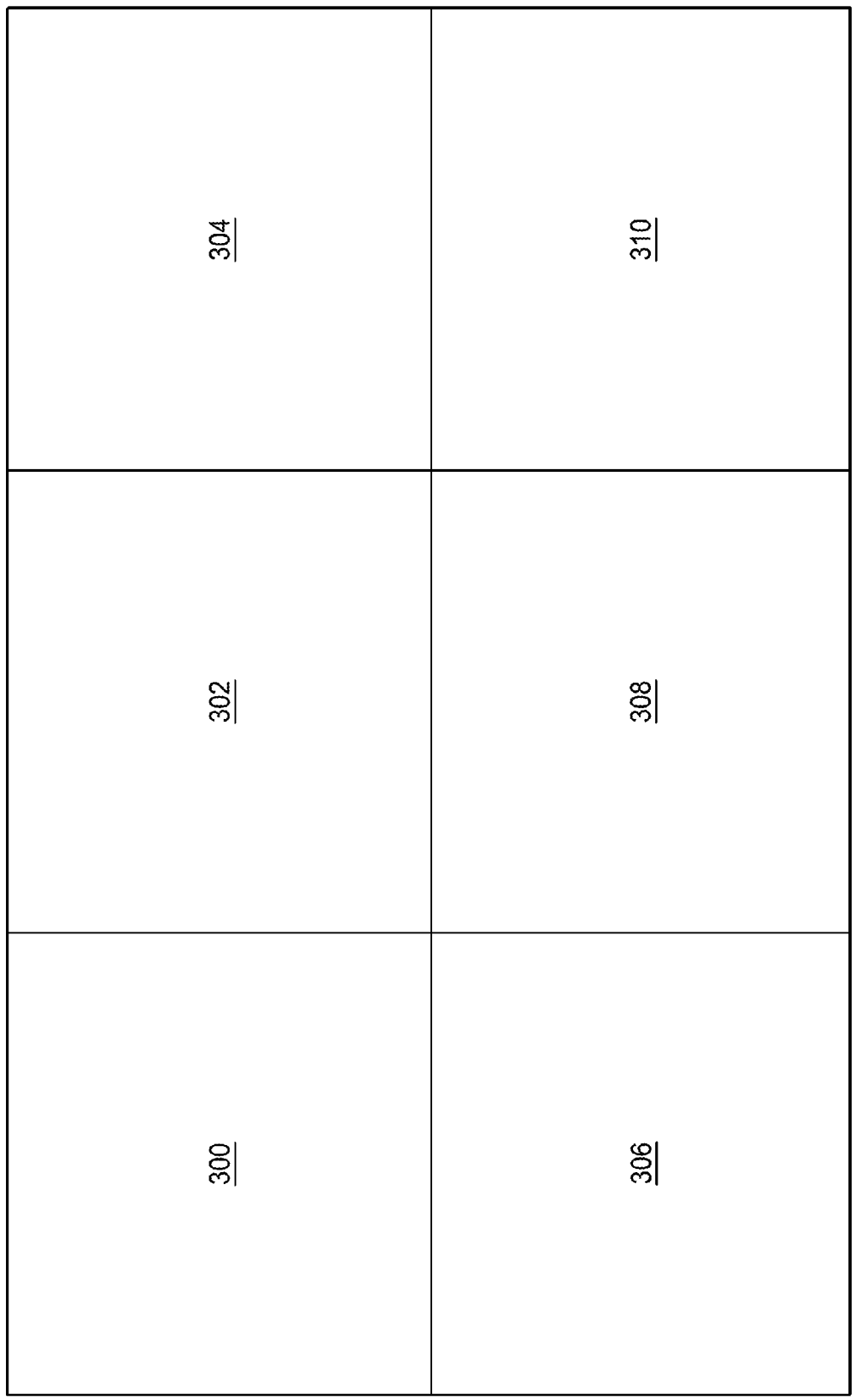
FIG. 12 shows another GUI having multiple windows and implemented by the disclosed sensor circuit design tool upon selection of a particular sensor circuit solution.

Referring to FIG. 9, the create field 242 for each displayed sensor circuit solution includes a user selectable button 261. Upon selecting that button (e.g., by a mouse click), the GUI 299 of FIG. 12 is displayed preferably replacing GUI 200. GUI 299 is specific to the particular solution whose button 261 was selected by the user. GUI 299 preferably includes 6 windows 300-310 which are described below. The user can select (e.g., by a mouse click) each window, and the contents of the selected window are enlarged for better viewability.

Figure 13:
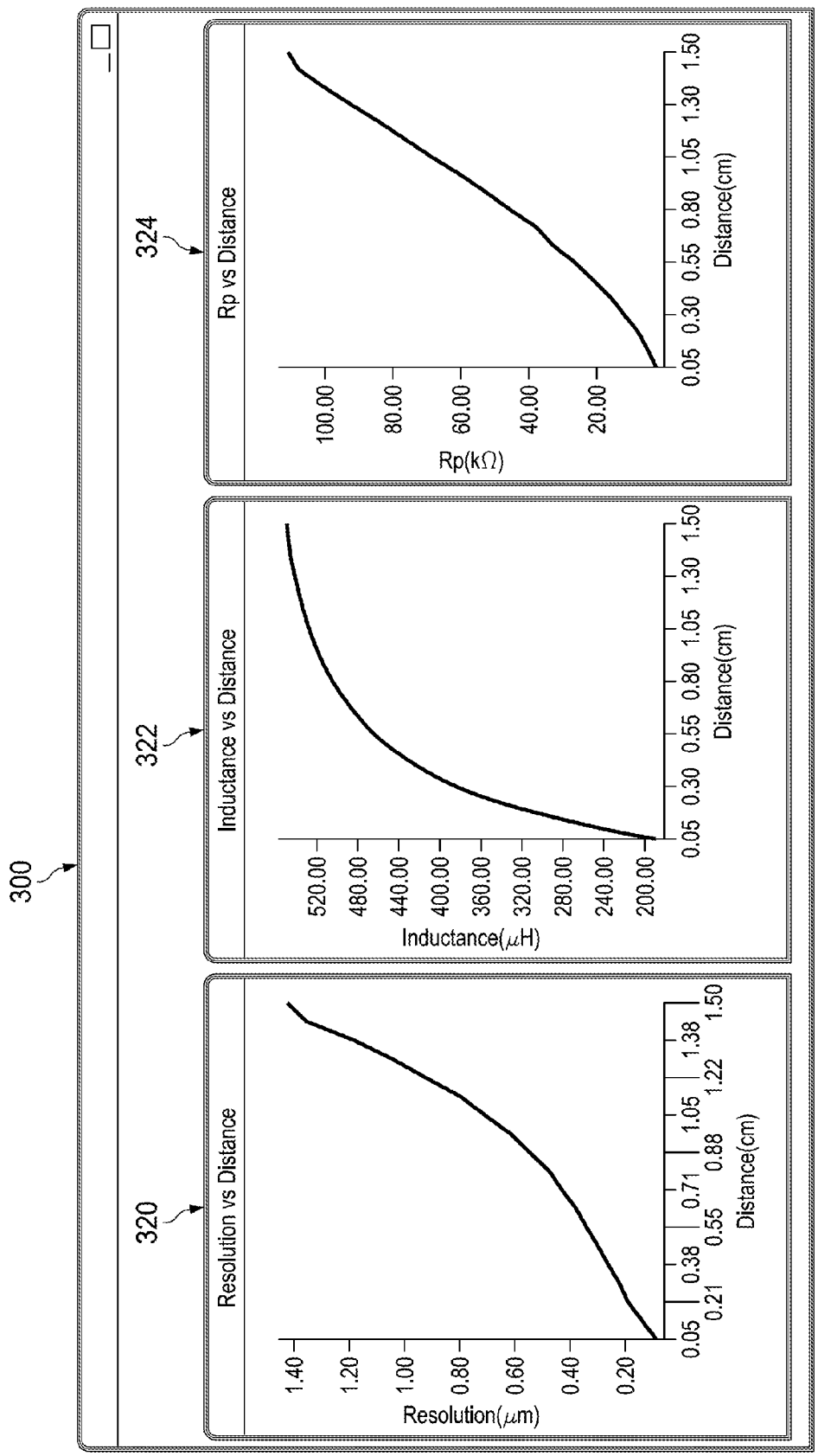

Referring now to FIG. 13, window 300 includes various performance curves for the selected solution. Curve 320, for example includes a plot of resolution versus distance. Curve 322 includes a plot of inductance versus distance, and curve 324 includes a plot of parallel resistance versus distance. The resolution versus distance curve enables a user to get an idea of how resolution varies with distance—the closer the target 125 is to the coil, the better is the resolution. Users can use this information to determine a "sweet spot" for operation.

Figure 14:
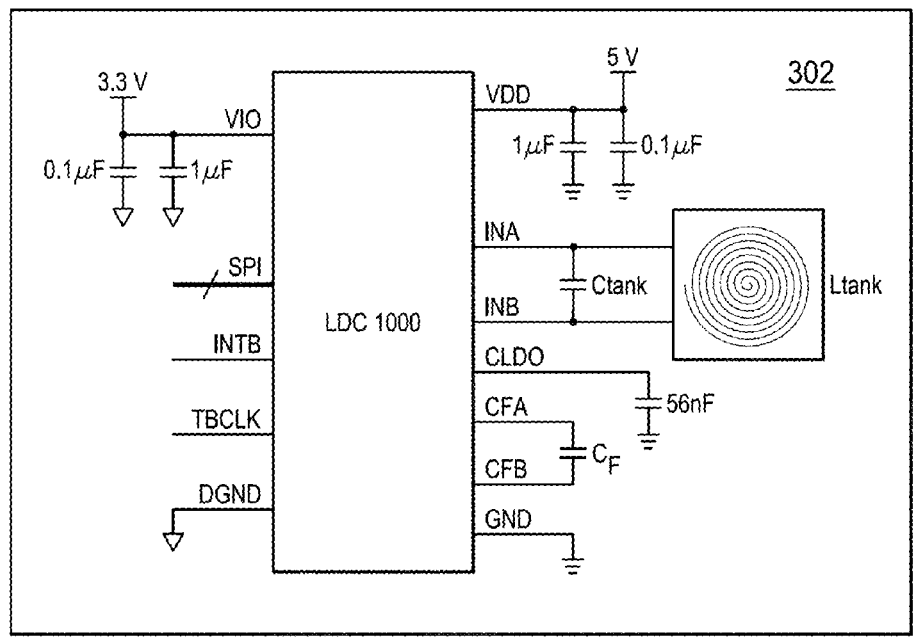

Referring to FIG. 14, window 302 shows a graphical image depicting the circuit schematic for the solution.

Figure 15:
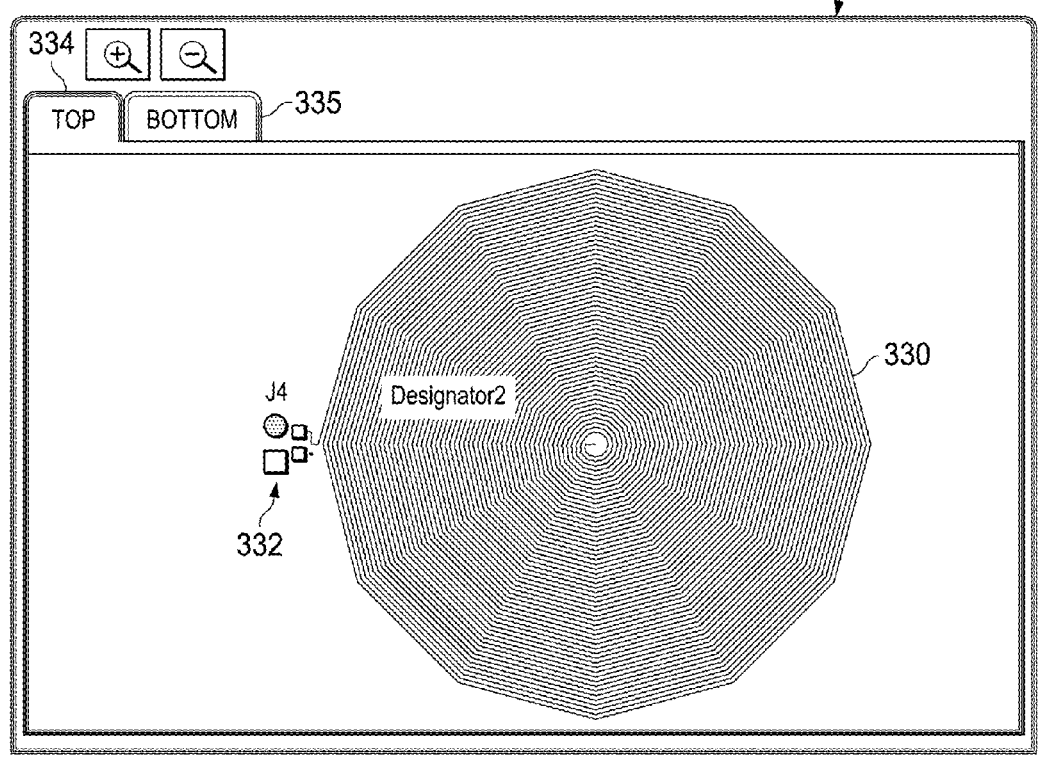
Figure 16:
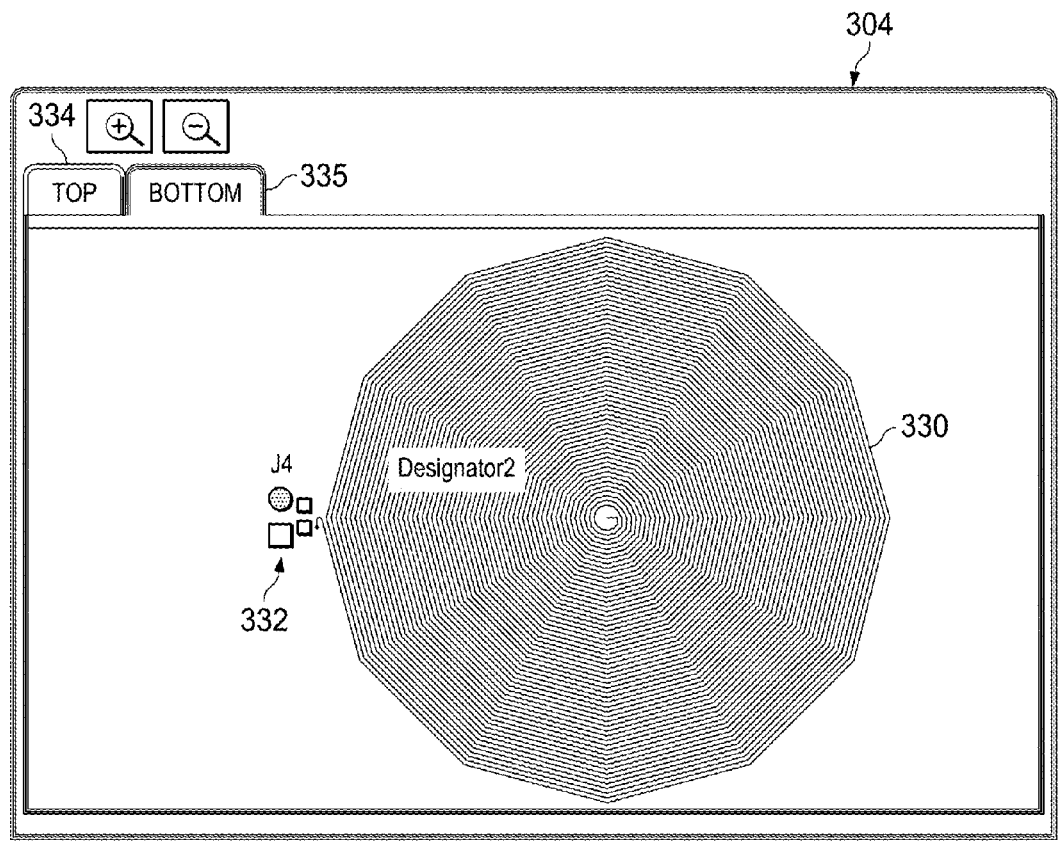

FIGS. 15 and 16 shows an example of window 304 which includes a circuit board layout depicting the dynamically generated (based on number of layers and turns) coils 330 and various connection points 322 for which the various coils connect. The top and bottom side of the circuit board can be viewed by selection of soft buttons 334 and 335 for a two layer/coil solution. Four layer solutions will include soft buttons for all four layers.

Figure 19:
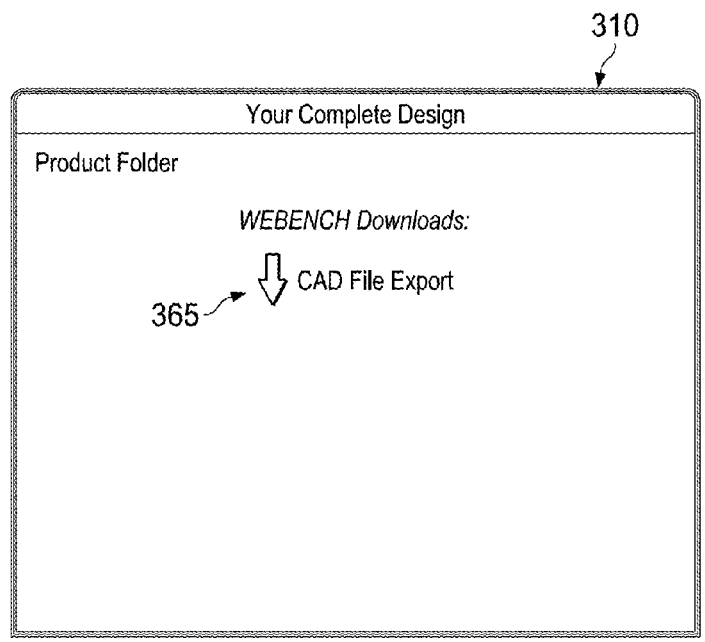

FIG. 17 shows an example of window 306 which includes a table of the operating values. FIG. 18 shows an example of window 308 which includes a bill of materials, and real components are selected and displayed based on the calculated component values. Finally, FIG. 19 shows an example of window 310 which includes a user-selectable control 365 by which the user can export a file (PCB coil sensor circuit) to a computer-aided design (CAD) format to then be imported into a CAD program. This capability permits a user to include a desired sensor circuit into a larger circuit the user may be designing.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A non-transitory storage device comprising machine readable instructions that, when executed by a processing resource, cause the processing resource to:
   receive input from a user via a graphical user interface (GUI) through a first window, the input including a distance value and an input resolution value;
   detect a selection by the user of a soft control;
   as a result of detecting the selection of the soft control, generate a plurality of sensor circuit solutions based on the received input; and
   cause the plurality of sensor circuit solutions to be displayed;
   wherein each sensor circuit solution specifies information about a conductive coil; and
   wherein for each displayed sensor circuit solution, the information includes a coil footprint size, a number of turns of a coil, a coil diameter, a number of layers, a calculated resolution value, a free field inductance value, a parallel equivalent resistance value, an external capacitance value, and a free field frequency.

2. The non-transitory storage device of claim 1 wherein the received input further includes a diameter value of a target material.

3. The non-transitory storage device of claim 1 wherein, when executed, the machine readable instructions cause the processing resource to display a graph of the plurality of sensor circuit solutions.

4. The non-transitory storage device of claim 3 wherein the graph plots a first parameter of each sensor circuit solution against a second parameter of each sensor circuit solution, and the graph includes a bubble for each sensor circuit solution whose size encodes a third parameter of the sensor circuit solution.

5. The non-transitory storage device of claim 1 wherein the machine readable instructions, when executed, cause the processing resource to:
   display a plurality of slider controls;
   receive input from a user operating any of the slider controls; and
   change which sensor circuit solutions are to be displayed based on the received user input of the slider controls, wherein the slider controls permit a user to adjust at least one of a conductive coil diameter, a conductive coil footprint size, a resolution, a capacitance, a number of layers, an inductance, a number of turns and a resistance.

6. The non-transitory storage device of claim 1 wherein the machine readable instructions, when executed, cause the processing resource to:
   select a plurality of contour regions, each contour region corresponding to a particular combination of the received input; and
   based on contour regions corresponding to the user input, select a coil diameter to generate each sensor circuit solution.

7. The non-transitory storage device of claim 6 wherein each sensor circuit solution specifies the conductive coil having a diameter and is for a particular target at a particular distance from the conductive coil, and each contour region provides a relationship between the coil diameter and a target-to-conductive coil distance for a common resolution value.

8. The non-transitory storage device of claim 7 wherein each contour region corresponds to a particular combination of coil diameter, target-to-coil distance; target material, target diameter; and frequency and all points within the contour region correspond to a common resolution value.

9. The non-transitory storage device of claim 1, wherein the plurality of sensor circuit solutions is configured to be exported to a computer aided design format, in response to an input.

10. A system, comprising:
    a user input engine to receive input via a graphical user interface (GUI) through a first window, the input including a distance value and an input resolution value; and
    a sensor circuit solution generation engine to generate a plurality of sensor circuit solutions based on the received input and to cause the plurality of sensor circuit solutions to be displayed;
    wherein each sensor circuit solution specifies information about a conductive coil; and
    wherein, for each displayed sensor circuit solution, the information includes at least one of a coil footprint size, number of turns of a coil, a coil diameter, a number of layers, a calculated resolution value, a free field inductance value, a parallel equivalent resistance value, an external capacitance value, and a free field frequency.

11. The system of claim 10 wherein the received input further includes a diameter value of a target material.

12. The system of claim 10 wherein the sensor circuit solution generation engine causes a graph of the plurality of sensor circuit solutions to be displayed.

13. The system of claim 10 wherein the sensor circuit solution generation engine:
    causes a plurality of slider controls to be displayed;
    receives input from a user operating any of the slider controls; and
    changes which sensor circuit solutions are caused to be displayed based on the received user input of the slider controls,
    wherein the slider controls permit a user to adjust at least one of a conductive coil diameter, a conductive coil footprint size, a resolution, a capacitance, a number of layers, an inductance, a number of turns and a resistance.

14. The system of claim 10 wherein the sensor circuit solution generation engine causes a second GUI to be displayed upon a user selecting one of the generated sensor circuit solutions, wherein the second GUI includes at least one of performance curves, a circuit schematic image, a board layout image, a table of operating values, and a bill of materials list.

15. A method of designing a sensor circuit solution, comprising:
   receiving user input including a maximum distance of a target to a coil, a minimum resolution, a target diameter, and a target material;
   generating contour regions with common resolutions for multiple combinations of target diameter, target material, target-to-coil distance, number of coils, and frequency; and
   based on contour regions corresponding to the user input, select a coil diameter to generate each sensor circuit solution;
   wherein, for each generated sensor circuit solution, the information includes at least one of a coil footprint size, a number of turns of a coil, a coil diameter, a number of layers, a calculated resolution value, a free field inductance value, a parallel equivalent resistance value, an external capacitance value, and a free field frequency.

16. The method of claim 15 further comprising generating multiple simulations for inductance versus target-to-coil distance as well as resistance versus target-to-coil distance.

17. The method of claim 16 further comprising applying smoothing algorithm to at least some of the simulations.

* * * * *